United States Patent
Wang et al.

(10) Patent No.: US 6,258,694 B1
(45) Date of Patent: Jul. 10, 2001

(54) FABRICATION METHOD OF A DEVICE ISOLATION STRUCTURE

(75) Inventors: Chien-Jung Wang; Ling-Sung Wang, both of Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/393,983

(22) Filed: Sep. 10, 1999

(30) Foreign Application Priority Data

Aug. 12, 1999 (TW) .................................... 88113788

(51) Int. Cl.⁷ ............................................ H01L 21/76
(52) U.S. Cl. ................................... 438/423; 438/444
(58) Field of Search .......................... 438/423, 444, 438/FOR 229, FOR 230; 148/DIG. 85, DIG. 86

(56) References Cited

U.S. PATENT DOCUMENTS 5,372,950 * 12/1994 Kim et al. .
5,972,777 * 10/1999 Hsu et al. .

OTHER PUBLICATIONS

IBM Tech. Disc. Bull., vol. 27, No. 11, pp. 6703–6704, Apr. 1985.*

* cited by examiner

*Primary Examiner*—George Fourson
*Assistant Examiner*—Joannie Adelle Garcia
(74) *Attorney, Agent, or Firm*—Jiawei Huang; J.C. Patents

(57) ABSTRACT

A fabrication method of a device isolation structure. A patterned mask layer is formed on a silicon substrate. A dopant is doped into an exposed substrate to prevent a bird's beak silicon region from being oxidized in a first doping step. A spacer is formed on the sidewall of the mask layer. Portions of the silicon substrate are removed to form a trench by using the mask layer and the spacer as a mask. A second dopant is doped into the exposed silicon substrate on the bottom of the trench to benefit the oxidation of a desired field oxide region in a second doping step. A field oxide layer is formed to fill the trench in a field oxide process.

22 Claims, 2 Drawing Sheets

FABRICATION METHOD OF A DEVICE ISOLATION STRUCTURE

CROSS-REFERENCE TO RELATED APPLICATION

This application claims the priority benefit of Taiwan application serial no. 88113788, filed Aug. 12, 1999, the full disclosure of which is incorporated herein by reference.

BACKGROUND OF THE INVENTION

1. Field of the Invention

The invention relates to a fabrication method of a semiconductor device, and more particularly, to a fabrication method of a device isolation structure.

2. Description of the Related Art

Today, development in integrated circuit fabrication is blooming. Minimization of devices is the mainstream. When the size of the device decreases, the integration of the device increases. That is, the isolation between devices must be minimized. Thus, isolation between devices becomes intractable. According to the prior art, a field oxide layer formed by local oxidation is used as the device isolation. However, edge corners of the field oxide (FOX) layer formed by local oxidation are bird's beak-shaped, and stresses may be induced. Due to bird's beak formation, it is difficult to minimize the FOX layer. Thus, it is difficult to adapt the local oxidation process to the sub-half micron process.

SUMMARY OF THE INVENTION

According to this, the invention provides a fabrication method of a device isolation structure to form an embedded FOX layer that shortens a bird's beak region and reduces the stresses. The invention can apply to the fabrication of a high integration device.

The invention provides a fabrication method of a device isolation structure. A patterned mask layer is formed on a silicon substrate. The mask layer has a trench opening that aligns with a desired isolation region that comprises a field oxide region and a bird's beak region. A first dopant is doped into the silicon substrate exposed by the trench opening in a first doping step to dope the silicon substrate of the bird's beak region. The first dopant such as nitrogen can prevent the silicon from being oxidized. A spacer is formed on sidewalls of the mask layer. The mask layer and the spacers are used as a mask to remove portions of the silicon substrate and to form a trench in the silicon substrate. A second dopant is doped into the exposed bottom of the trench in a second doping step to dope the silicon substrate of the field oxide region. The second dopant such as oxygen can benefit the oxidation of the silicon. A field oxide process is performed to form and to fill a field oxide layer in the trench in order to isolate the device.

Since the silicon substrate of the bird's beak region is doped by the first dopant to prevent the silicon from being oxidized, the formation of a bird's beak structure is inhibited, and the length of the bird's beak structure and the stresses are reduced. Additionally, the second dopant doped into the silicon substrate of the field oxide region to benefit the oxidation of the silicon is useful for forming the FOX layer in order to prevent the formation of the FOX layer from being affected by an embedding process.

According to the invention, an embedded FOX layer can have a bird's beak structure that is shorter than the traditional one and reduce stresses. Furthermore, it can adjust the width of a FOX layer according to the width of a trench opening; thus, the FOX layer is adjustable and not affected by the bird's beak-shape structure.

It is to be understood that both the foregoing general description and the following detailed description are exemplary, and are intended to provide further explanation of the invention as claimed.

DESCRIPTION OF THE PREFERRED EMBODIMENTS

Figure 1A:
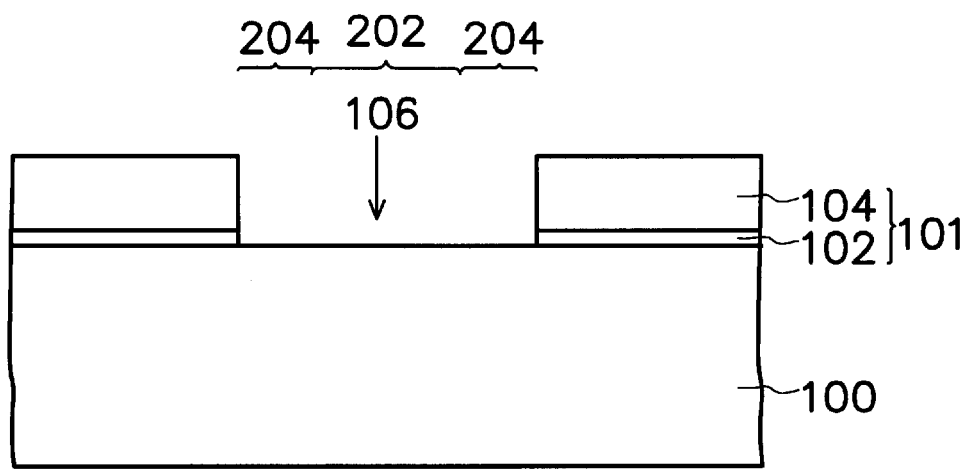
FIG. 1A through FIG. 1F are schematic, cross-sectional views showing a process according a preferred embodiment of the invention.

Referring to FIG. 1A, a silicon substrate 100 is provided. The silicon substrate 100 is at least divided into an active region and an adjacent device isolation region. The device isolation region is assigned to a FOX region 202 of a later-formed FOX layer. Portions of the active region around the FOX region 202 are regarded as a bird's beak region 204.

A patterned mask layer 101 used to form a device isolation is formed on the silicon substrate 100. The mask layer 101 is, for example, a hard mask layer. For example, the mask layer 101 comprises a silicon oxide layer 102 having a thickness of about 10–300 Å and a silicon nitride layer 104 having a thickness of about 10–3000 Å. The mask layer 101 has a trench opening 106 used to form a device isolation structure. The width of the opening 106 is wider than the FOX region 202 and aligns with the FOX region 202 and the bird's beak region 204. A well-known process is used to form the mask layer 101, so the details of the process are not provided here.

Figure 1B:
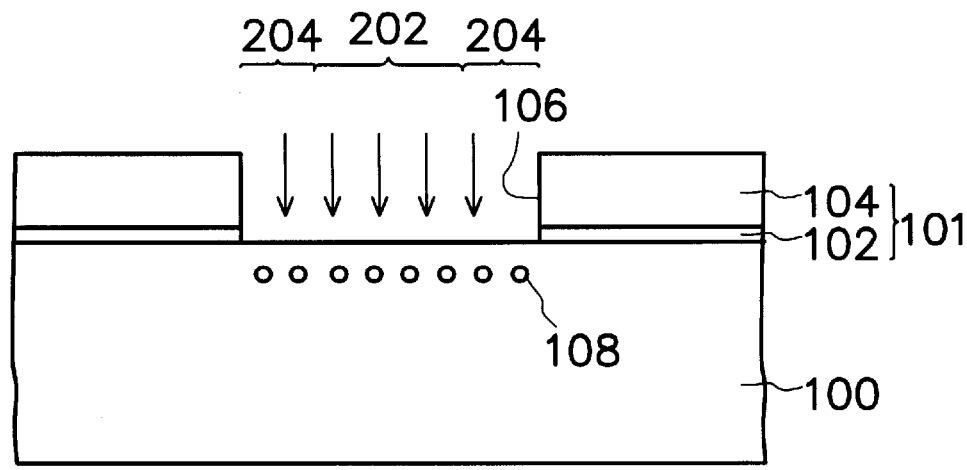

Referring to FIG. 1B, a first doping step is performed. The silicon substrate 100 exposed by the trench opening 106 is doped by a first dopant 108 in order to reduce the oxidation rate of the silicon in the bird's beak region 204. The first dopant is, for example, nitrogen. The doping method is, for example, ion implantation. The operation conditions of the ion implantation are, for example, a power of about 10–70 KeV and a dosage of about $1\times10^{12}$–$1\times10^{13}/cm^2$ to efficiently inhibit the oxidation of the silicon.

Figure 1C:
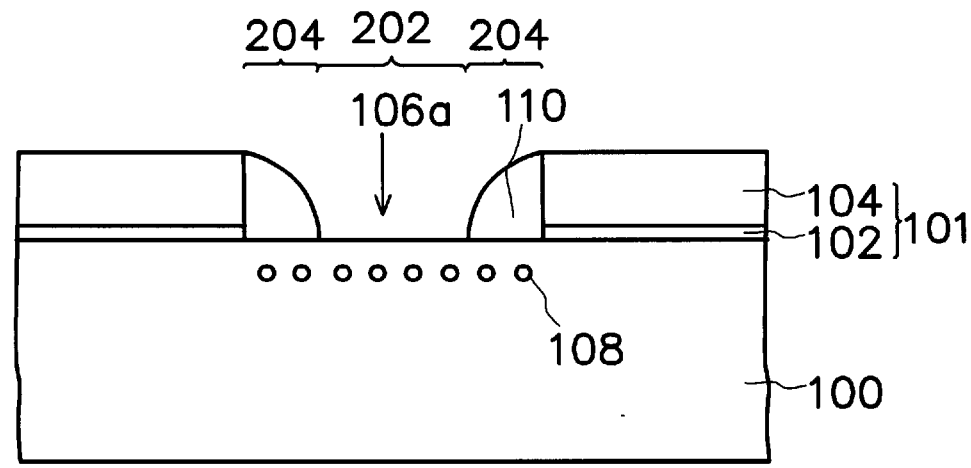

Referring to FIG. 1C, a spacer 110 is formed on the sidewall of the mask layer 101. That is, the spacer 110 is formed on the sidewall of the trench opening 106 in order to narrow the trench opening 106 and further to form a narrower trench opening 106a. The spacer 110 is, for example, formed by chemical vapor deposition. For example, a conformal silicon nitride layer having a thickness of 100–300 Å is formed by chemical vapor deposition on the silicon substrate 100, and then the silicon nitride layer is etched back to form the spacer 110.

Figure 1D:
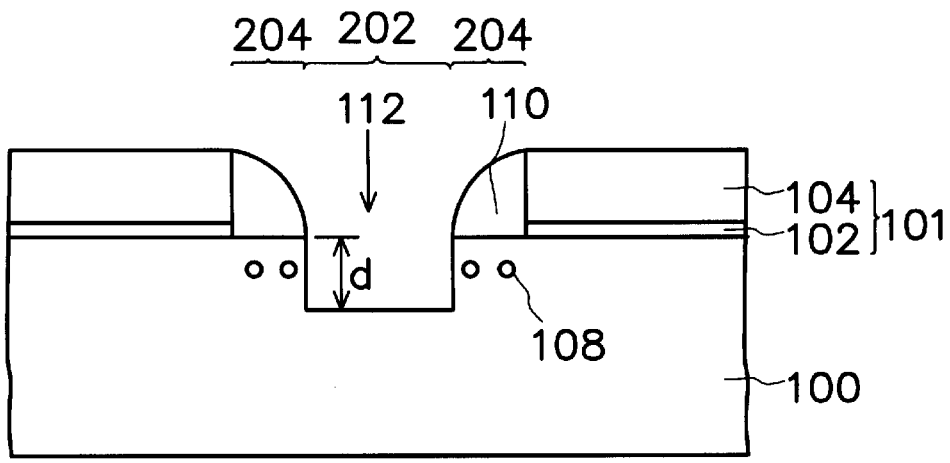

Referring to FIG. 1D, the mask layer 101 and the spacer 110 are used as the mask while removing portions of the silicon substrate 100 in the opening 106a (FIG. 1C) and to form a trench 112 for isolating the device by, for example, reactive ion etching. The depth of the trench 112 is preferably about 300–1000 Å with consideration for being able to fully fill the trench 112.

Figure 1E:
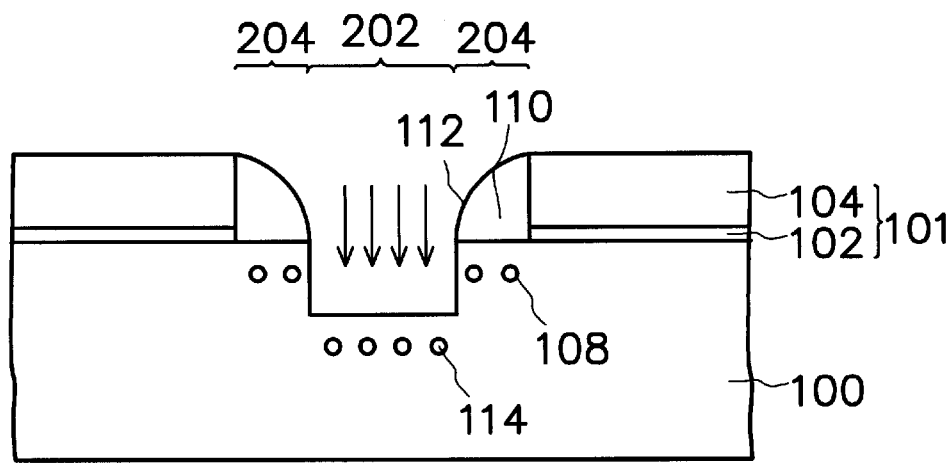

Referring to FIG. 1E, the exposed silicon substrate 100 in the bottom of the trench 112 is doped by a second dopant in a second doping step. That is, the silicon substrate of the FOX region is doped by the second dopant 114. The second dopant 114 can benefit the oxidation of the silicon substrate in the FOX region. The second dopant is, for example, oxygen. The doping process is, for example, ion implantation. Additionally, the higher concentration of oxygen enhances the oxidation rate. For example, the operation conditions of ion implantation are a power of about 10–70 KeV and a dosage of about $1\times10^{13}$–$1\times10^{15}/cm^2$ to efficiently enhance the oxidation of the silicon.

Due to the first dopant 108 doped into the silicon substrate beneath the spacer 110, the oxidation of the silicon substrate in the sidewall of the trench 112 is efficiently inhibited; thus, the formation of the bird's beak structure is inhibited, and the length of the bird's beak structure and the induced stresses are further reduced. In addition, the second dopant 114 doped into the silicon substrate of the bottom of the trench 112 benefits the oxidation of the silicon substrate in the FOX region 202; thus, the silicon in the FOX region 202 can be completely and efficiently oxidized.

Figure 1F:
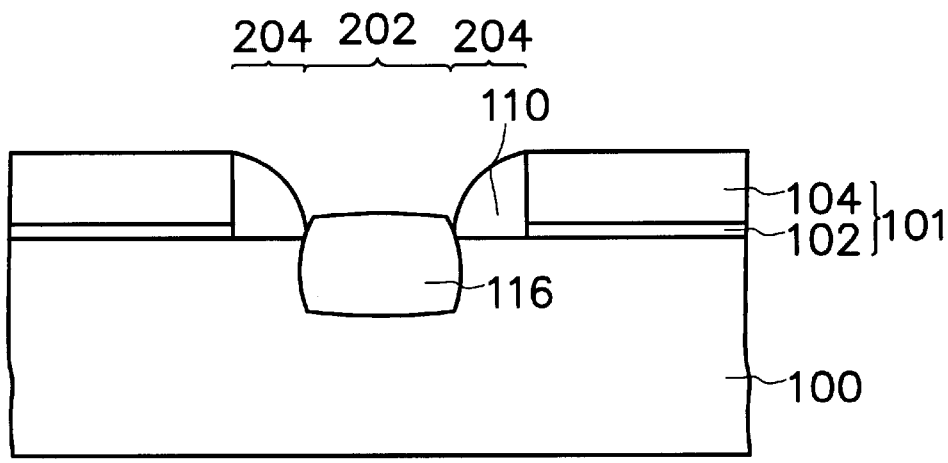

Referring to FIG. 1F, a well-known local oxidation process is performed to oxidize the silicon substrate 100 of the bottom of the trench 112 in the FOX process. In the FOX process, the oxidized silicon swells and fully fills the trench 112; thus, an embedded FOX layer is formed as a device isolation structure. However, due to the first dopant in the sidewall of the trench 112, the formation of the bird's beak structure of the embedded FOX layer is inhibited. The mask layer 101 and the spacer 110 are removing by, for example, wet etching.

According to the preferred embodiment of the invention, an embedded FOX layer used as a device isolation structure can efficiently inhibit the formation of a bird's beak structure and reduce the length of the bird's beak structure and the induced stresses.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A fabrication method of a device isolation structure, comprising:

forming a patterned mask layer on a silicon substrate;

performing a first doping step using the patterned mask layer as a first mask to dope a portion of the silicon substrate exposed by the first mask with a first dopant in order to inhibit an oxidation of the silicon;

forming a spacer on a sidewall of the mask layer;

removing portions of the silicon substrate to form a trench with the mask layer and the spacer serving as a second mask;

performing a second doping step to dope a portion of the silicon substrate exposed by the second mask at a bottom of the trench with a second dopant in order to benefit an oxidation of the silicon, wherein the second dopant comprises oxygen; and performing a field oxidation step to form a field oxide layer in the trench and to fill the trench.

2. The fabrication method of the device isolation structure of claim 1, wherein the mask layer comprises a silicon oxide layer and a silicon nitride layer.

3. The fabrication method of the device isolation structure of claim 1, wherein the first dopant comprises nitrogen.

4. The fabrication method of the device isolation structure of claim 1, wherein the first doping step comprises ion implantation.

5. The fabrication method of the device isolation structure of claim 4, wherein an operation power of the ion implantation is about 10–70 KeV.

6. The fabrication method of the device isolation structure of claim 4, wherein an operation dosage of the ion implantation is about $1\times10^{12}$–$1\times10^{13}/cm^2$.

7. The fabrication method of the device isolation structure of claim 1, wherein a material used as the spacer comprises silicon nitride.

8. The fabrication method of the device isolation structure of claim 1, wherein a depth of the trench is about 300–1000 Å.

9. The fabrication method of the device isolation structure of claim 1, wherein the second doping step comprises ion implantation.

10. The fabrication method of the device isolation structure of claim 9, wherein an operation power of the ion implantation is about 10–70 KeV.

11. The fabrication method of the device isolation structure of claim 9, wherein an operation dosage of the ion implantation is about $1\times10^{13}$–$1\times10^{15}/cm^2$.

12. A fabrication method of a device isolation structure applied to a silicon substrate that comprises a field oxide region and a bird's beak region at an edge of the field oxide region, the method comprising:

performing a first doping step to dope the silicon substrate in the field oxide region and the bird's beak region with a first dopant to inhibit an oxidation of the silicon;

removing the silicon substrate in the field oxide region to form a trench;

performing a second doping step to dope the silicon substrate in the field oxide region only with a second dopant in order to benefit an oxidation of the silicon at a bottom of the trench, wherein the second dopant comprises oxygen; and forming a field oxide layer in the trench and to fill the trench.

13. The fabrication method of the device isolation structure of claim 12, wherein the first dopant comprises nitrogen.

14. The fabrication method of the device isolation structure of claim 12, wherein the first doping step comprises ion implantation.

15. The fabrication method of the device isolation structure of claim 13, wherein an operation power of the ion implantation is about 10–70 KeV.

16. The fabrication method of the device isolation structure of claim 13, wherein an operation dosage of the ion implantation is about $1\times10^{12}$–$1\times10^{13}/cm^2$.

17. The fabrication method of the device isolation structure of claim 13, wherein a fabrication method of the trench comprises:

forming a mask layer to cover the bird's beak region; and removing portions of the silicon substrate in the field oxide region to form a trench in the field oxide region.

18. The fabrication method of the device isolation structure of claim 12, wherein a depth of the trench is about 300–1000 Å.

19. The fabrication method of the device isolation structure of claim 12, wherein the second doping step comprises ion implantation.

20. The fabrication method of the device isolation structure of claim 19, wherein an operation power of the ion implantation is about 10–70 KeV.

21. The fabrication method of the device isolation structure of claim 19, wherein an operation dosage of the ion implantation is about $1\times10^{13}$–$1\times10^{15}/cm^2$.

22. The fabrication method of the device isolation structure of claim 12, wherein a spacer is formed to mask the bird's beak region while performing the second doping step.

* * * * *